United States Patent [19]

Cline et al.

[11] 4,207,670

[45] Jun. 17, 1980

[54] METHOD FOR MAKING A SOLID STATE NEURON

[75] Inventors: Harvey E. Cline, Stanford, Calif.; Thomas R. Anthony; Ivar Giaever, both of Schenectady, N.Y.

[73] Assignee: General Electric Company, Schenectady, N.Y.

[21] Appl. No.: 946,610

[22] Filed: Sep. 28, 1978

[51] Int. Cl.² .............................................. B01J 17/00
[52] U.S. Cl. ................................... 29/576 C; 29/590; 357/60
[58] Field of Search ..................... 29/576, 590; 357/60

[56] References Cited

U.S. PATENT DOCUMENTS 2,813,048  11/1957  Pfann ................................. 148/171

Primary Examiner—W. C. Tupman
Attorney, Agent, or Firm—Donald M. Winegar; James C. Davis, Jr.; Leo I. MaLossi

[57] ABSTRACT

Temperature gradient zone melting is utilized to make a solid state neuron which mimics the conducting nerve pulses by a biological nerve cell and its nerve fiber.

13 Claims, 6 Drawing Figures

METHOD FOR MAKING A SOLID STATE NEURON

BACKGROUND OF THE INVENTION

1. Field of the Invention

This invention relates to a method for making a semiconductor neuron that mimics the operation of a biological nerve cell and nerve fiber.

2. Background of the Invention

A biological nerve fiber in an animal structurally resembles a coaxial cable. The nerve fiber has an inner central core of an electrically conducting axoplasm surrounded by a thin membrane sheath and is immersed in the electrically conductive body fluids of the animal. All nerve cells and nerve fibers having a resting potential of 60-100 millivolts applied across the thin membrane sheath between the inner axoplasm core and surrounding body fluids. This resting potential is in a direction such that the inner axoplasm core is negatively charged with respect to the surrounding fluids and can be measured by penetrating the membrane sheath with a microelectrode and measuring the potential difference between the inner axoplasm core and the surrounding body fluids.

The membrane sheath of the nerve fiber normally acts as an insulating barrier while a nerve is resting. However, when the nerve is conducting nerve pulses, the membrane sheath actively responds to a depolarizing current (that is, a current that flows in a direction so as to eliminate the potential difference between the inner axoplasm core and the surrounding body fluids). For depolarizing currents above a critical threshold, typically $10^{-6}$ to $10^{-3}$ amps/cm$^2$, the axon membrane actively increases the depolarizing current and adds to the original stimulus current. In other words, the membrane above a critical threshold depolarizing current acts as a differential negative resistor like a tunnel diode and actively assists depolarizing. In contrast, the membrane does not make any active response to a hyperpolarizing current (that is, a current that flows in a direction so as to increase the potential difference between the inner axoplasm core and the surrounding body fluids).

If a nerve is stimulated at one end by causing a depolarizing current greater than the critical threshold current to flow through the membrane sheath at the point of stimulus, the resistance of the membrane will decrease rapidly at this point allowing more current to pass through the membrane. This current will change the potential of the inner axoplasm core of the nerve at the point of stimulus. The change of potential will generate a flow of current in the axoplasm core away from the stimulus point along the inner core of the nerve fiber. As the current flows away from the stimulus point along the inner core, the current is gradually diverted through the surrounding membrane sheath and flows in a reverse direction through the surrounding body fluids back to the stimulus point. Here it again flows through the active membrane assisting the depolarizing current flow into the inner core and completing the current circuit. The area of the membrane actively boosting the depolarizing current spreads laterally along the axon as the depolarization current increases to the critical threshold in adjacent sections of the nerve fiber. At the same time at the original point of stimulus, the membrane which is acting like a capacitor discharging through a parallel differential negative resistance exhausts its ability to actively boost the depolarizing current which as a consequence decays at this point to zero. As a consequence of the differential negative resistance and the electrical capacitance of the membrane sheath of the nerve, a potential spike is formed which propagates away from the original stimulus point towards unstimulated sections of the nerve fiber. In this manner, a nerve pulse is conducted from one end of a nerve fiber to the other end.

An object of this invention is to provide a method for making a semiconductor neuron whose electrical properties will mimic those of a biological neuron.

Another object of this invention is to provide a method for making a tunnel diode by thermal gradient zone melting which will function as a semiconductor neuron.

Other objects of this invention will, in part, be obvious and will, in part, appear hereinafter.

BRIEF DESCRIPTION OF THE INVENTION

In accordance with the teachings of this invention there is provided a method for making a semiconductor neutron which functions in a manner similar to a biological neuron. The method includes selecting a body of semiconductor having two opposed major surfaces one of which has a preferred planar crystal orientation which is one selected from the group consisting of (100), (110) and (111). The body has a vertical axis which is substantially vertical to the two opposed major surfaces, a predetermined level of resistivity and at least one region of degenerative semiconductor material disposed in the body. Each first region extends entirely through the body, terminating in the opposed major surfaces and having two opposed end surfaces. Each end surface is coextensive with a respective one of the major opposed end surfaces of the body.

At least one droplet of a selective metal is disposed on a selective portion of one end of the first region. The body and the one or more droplets are heated to an elevated temperature sufficient to form a melt of the droplet of material and the semiconductor material on the major surface of the body. A unidirectional thermal gradient is established across the body between the two major opposed surfaces. The thermal gradient is established substantially parallel to the vertical axis and may be parallel with, or off-axis with, a predetermined crystal axis of the material of the body.

Each alloy melt is migrated by temperature gradient zone melting processing through the solid material of the body to form a second region of degenerative recrystallized semiconductor material of the body having a conductivity type opposite to that of the first region in which it is formed. The recrystallized semiconductor material of the second region has solid solubility of the selective metal therein, the concentration of which is substantially uniform through the second region. The second region extends between, and terminates in, the two opposed major surfaces and has two opposed end surfaces, each of which is coextensive with a respective end surface of the first region and the major surface of the body.

P-N junction is formed by the abutting surfaces of the material of opposite type conductivity of each pair of first and second regions. The P-N junction extends between, and terminates in, the opposed major surfaces of the body. The degenerative material of the first and second regions imparts the electrical characteristics of a tunnel diode of the P-N junction which is essentially a step junction.

Ohmic electrical contacts are affixed to each of the two opposed end surfaces of each first and second regions. When a voltage pulse is applied across the P-N junction between the two ohmic electric contacts affixed to the coextensive surfaces of the two regions at one end thereof, it will appear later after a predetermined time interval across the P-N junction between the coextensive surfaces of the two regions at the other end thereof.

Alternately each first region of degenerative semiconductor material may also be made by temperature gradient zone melting prior to the formation of the second region.

DESCRIPTION OF THE INVENTION

Figure 1:
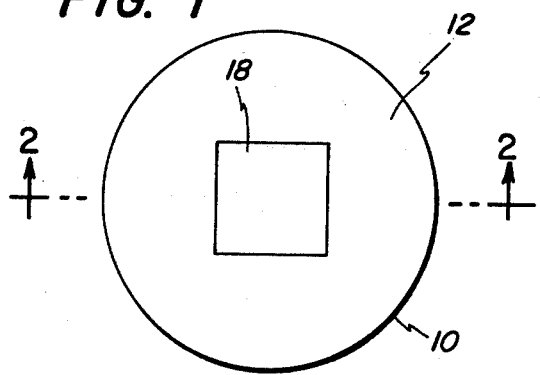
FIG. 1 is a top planar view of a body of semiconductor material being processed in accordance with the teachings of this invention.
Figure 2:
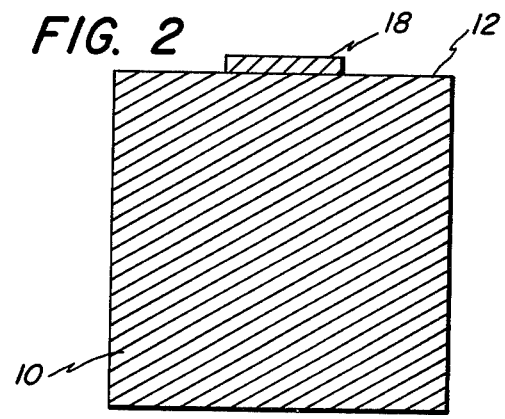
FIG. 2 is an elevation view, in cross-section, of the body of FIG. 1 taken along the cutting plane II-II.

With reference to FIGS. 1 and 2, there is shown a body 10 of semiconductor material having a first selected level of resistivity and first type conductivity. The body 10 has opposed major surfaces 12 and 14 which are the top and bottom surfaces respectively thereof. At least one of the major surfaces 12 and 14 has a preferred crystal planar orientation which is one selected from the group consisting of (100), (110) and (111). The semiconductor material comprising the body 10 may be silicon, germanium, a compound of a Group II element and a Group VI element and a compound of a Group III element and a Group V element. For purposes of illustration, the body 10 can be considered to be a single crystal ingot of N-type germanium. The body 10 has a vertical axis which is substantially perpendicular to the surfaces 12 and 14.

Normally the body 10, or at least one first region, has a wide distribution of atoms of dopant material that induces a first type conductivity and a first level of resistivity in the germanium. Generally, this first conductivity type will be opposite to the conductivity type of the recrystallized region to be produced by the migration of an alloy liquid droplet through the body 10 by thermal gradient zone melting.

The first step in the subject thermal migration process is to deposit on surface 12 in a preselected pattern a quantity of dopant material 18 that will impart to the N-type germanium a second P-type conductivity type and a second level of resistivity. An example of a dopant that works well with germanium is gallium and it will be used for purposes of illustration. Other P-type dopants include aluminum, indium and zinc.

An alternative to using a pure dopant deposit to form the liquid alloy droplet is to use a carrier droplet containing the desired dopant. (See patent application Ser. No. 944,280). Carrier metals that work in germanium include lead, tin, gold, indium, silver, cadmium, thallium and zinc. Of these carrier metals, the most practical are tin, gold, and indium and alloys and combinations thereof, which can be processed at low temperatures to prevent broadening of the P-N junction. The most practical dopants to be added to these carrier metals are aluminum and gallium for P-type doping and arsenic for N-type doping because these impurities can heavily dope germanium enough to make it degenerate as the P-N junction formed by the migration droplet must have the characteristics associated with a tunnel diode in order for the semiconductor neuron to operate properly.

The preselected pattern of the deposit can be any pattern described within the limits of stability taught by Cline et al. in U.S. Pat. No. 3,899,361. However, as illustrated in FIG. 1, the preselected pattern is a simple square as would be chosen if surface 12 is a (100) plane. Table I lists the preferred geometry of the dopant deposit 18 for various ingot orientations and migration directions.

Table I

| Ingot Plane | Migration Direction | Preferred Geometry | Stable Size |
|---|---|---|---|
| (100) | <100> | square | <100μ |
| (110) | <110> | diamond | <100μ |
| (111) | <111> | triangular or hexagonal | <500μ |

Also given in Table I are the dopant pattern sizes which result in stable thermal migration.

Following deposition of the gallium on surface 12 of the N-type germanium, the gallium deposit may be sintered or alloyed to surface 12 of the germanium ingot. Sintering or alloying is beneficial inasmuch as the gallium-germanium melt formed subsequently during thermal migration uniformly wets the germanium surface and assures excellent results.

Figure 3:
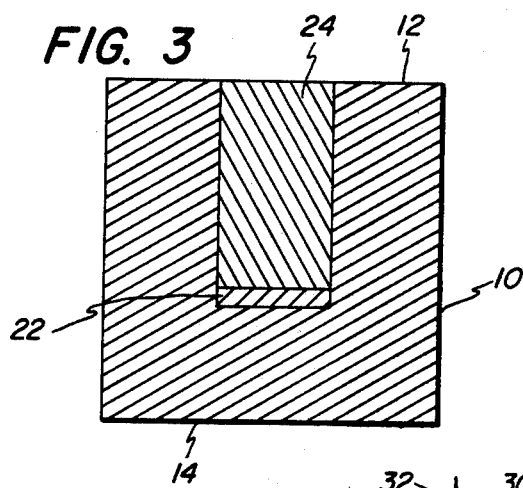
FIGS. 3 and 4 are elevation views, in cross-section, of the bodies of FIGS. 1 and 2 being processed further in accordance with the teachings of this invention.

Referring now to FIG. 3, the germanium ingot 10 with a deposited square of gallium is placed in suitable heating apparatus for practicing temperature gradient zone melting with the ingot or body 10 depicted in FIGS. 1 and 2 so that a unidirectional thermal gradient is established in the direction marked TG in FIG. 3, the thermal gradient being substantially parallel to the vertical axis of the body 10 and a preferred crystal axis of the material of the body 10. First, a gallium-rich melt 22 of germanium is forced on surface 12 as body 10 is heated above the gallium-germanium eutectic temperature of 29.8° C. This melt 22 begins to dissolve germanium on the hottest side thereof (that is, below it is viewed in FIG. 3). A unidirectional thermal gradient is established through the body 10 between the surface 12 and 14 and substantially parallel to, a preferred crystal axis of the material of the body 10. Alternately, the unidirectionally temperature gradient is established at a predetermined number of degrees off-axis of a preferred crystal axis of the material of the body 10. Concurrently, germanium begins to recrystallize on the coolest side of the melt (that is, above it as viewed in FIG. 3). Thus, the liquid melt 22 migrates up the temperature gradient into the interior of the ingot. (That is, in a downward direction in FIG. 3). Behind the liquid melt 22, a recrystallized region 24 of P-type germanium doped with gallium to the solid solubility limit is left behind.

The process is continued for a sufficient period of time and the liquid melt 22 emerges on the hot side 14 of the germanium ingot. The recrystallized material of the body 10 forms the P-type region 24 and extends through the entirety of the germanium ingot 10 and forms the P-N junction 28 therebetween. The processing time depends on the ingot, or body 10, thickness, the temperature, the temperature gradient, which may be from 20° C./cm to 300° C./cm and the P-N type dopant comprising part of the alloy melt. For a germanium ingot of 2 cm thickness, a temperature of 900° C., a temperature gradient of 100° C./cm and a gallium-germanium melt, the processing time is about six hours. Other restrictions that will be listed later will restrict processing temperatures to lower temperatures than 900° C.

Following the above migration procedure, the ingot 10 is removed from the thermal migration processing apparatus and the solidified droplet is removed from surface 14 by lapping, etching or the like. The resulting processed ingot is shown schematically in FIG. 4.

Figure 4:
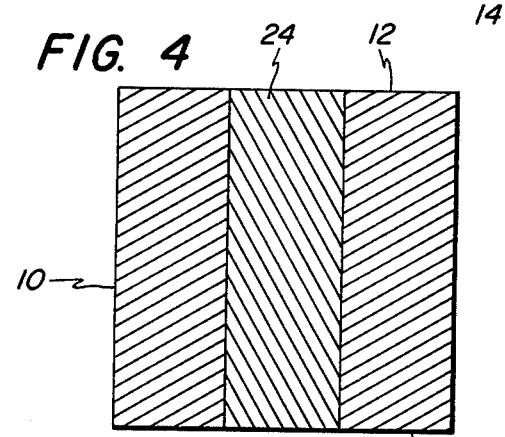
Figure 5:
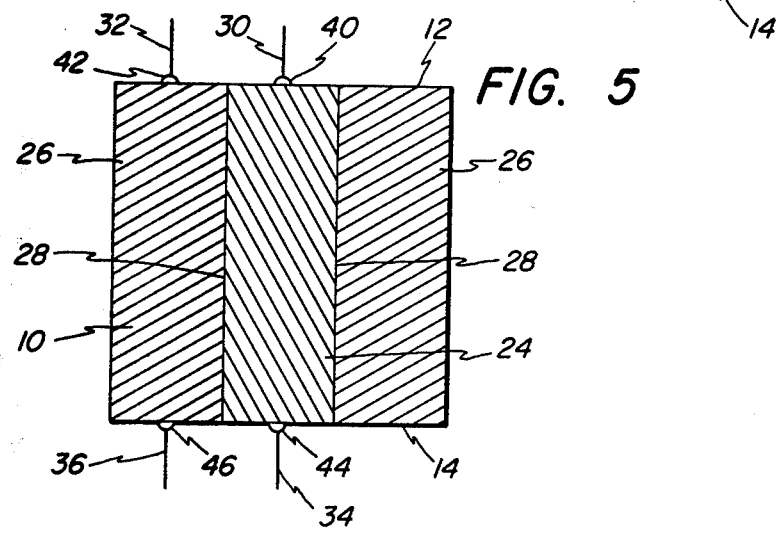
FIG. 5 is an elevation view in cross-section of the semiconductor neuron made in accordance with the teachings of this invention.

Referring now to FIG. 5, a semiconductor neuron is formed from the processed ingot 10 illustrated in FIG. 4 by attaching ohmic electrical leads 30 and 32 by contacts 40 and 42 to the P-type region 24 and the N-type region 26, respectively, on surface 12. Ohmic electrical leads 34 and 36 are similarly attached to the P-type region 24 and the N-type region 26 by contacts 44 and 46, respectively, on surface 14.

The part of the semiconductor neuron analogous to the membrane sheath of the biological neuron is the P-N junction 28. In order that the P-N junction 28 of the semiconductor neuron have the differential resistance exhibited by the membrane sheath of the biological neuron, the P-N junction 28 must have the electrical characteristics of a tunnel diode. In order that the P-N junction 28 have tunnel diode characteristics, both the P-type and N-type regions must be degenerate. For germanium, this requires that the P-dopant and N-dopant concentrations be greater than $2 \times 10^{19}$ atoms/cm$^3$, making high solubility N-type impurities such as phosphorous and arsenic and high solubility P-type impurities such as aluminum and gallium the most practical dopants for germanium.

The tunneling current of a tunnel diode varies exponentially with the negative of the junction barrier width. Since it is the tunnel current phenomenon that gives rise to the differential negative resistance that is required by the semiconductor neuron, it is advantageous to have a small barrier width to maximize the tunneling current. Consequently, a step type P-N junction is necessary.

Both diffusion and epitaxial growth result in graded P-N junctions that are too wide for tunnel diodes. In contrast, doping by thermal migration at relatively low temperatures results in a step junction of the type required by a tunnel diode. However, even in the case of thermal migration, the migration temperature and time must be carefully selected to avoid the broadening of the P-N junction that would decrease the tunneling current. In fact, once a dopant or a carrier metal-dopant combination has been chosen, the freedom in selecting an alloy temperature and time is limited.

For purposes of illustration, consider germanium requiring a doping density in excess of $2 \times 10^{19}$ atoms/cm$^3$ for tunneling. The germanium body may be doped N-type during crystal growth with arsenic to a level of $10^{20}$ atoms/cm$^3$. Using a gallium-rich alloy droplet, the germanium may be P-doped with $2 \times 10^{20}$ atoms/cm$^3$ at temperatures as low as 120° C. with processing by thermal gradient zone melting. If processing is carried out at 300° C., the maximum processing time before diffusion broadening of the junction begins to degrade the desired tunneling characteristics in about ten days. With a temperature gradient of 200° C./cm, the gallium-rich droplet migrates and forms a P-doped recrystallized zone 1 cm in length in this time period. Under these conditions, the maximum length of a semiconductor neuron is approximately 1 cm.

Table II gives the time limits for the migration process by thermal gradient zone melting required to prevent diffusion broadening of the P-N junction ($\sqrt{Dt} \leq 20$Å) for various temperatures for a gallium liquid droplet migrating through a germanium ingot.

Table II

| Temperature (°C.) | Time limit (seconds) | Maximum-neuron length (cm) |
|---|---|---|
| 100 | $10^8$ | ↑ |
| 200 | $10^7$ | greater than 1cm |
| 300 | $10^6$ | 1cm |
| 400 | $10^5$ | ↑ |
| 500 | $10^4$ | ↑ |
| 600 | $10^3$ | less than 1cm |
| 700 | $10^2$ | ↓ |
| 800 | $10^1$ | ↓ |
| 900 | 1 | ↓ |

Referring now to FIG. 5, electrical contacts 40 and 44 affixed to the P-type region comprise an alloy of indium or tin containing greater than two atomic percent Ga or As. Electrical contacts 42 and 46 affixed to the N-type germanium comprise an alloy of In or tin containing greater than two atomic percent antimony. All electrical contacts are formed by alloying at the lowest practical temperature to minimize diffusional broadening. For a tin alloy, the minimum alloying temperature is approximately 230° C. The minimum alloying temperature for an indium alloy is about 160° C.

Figure 6:
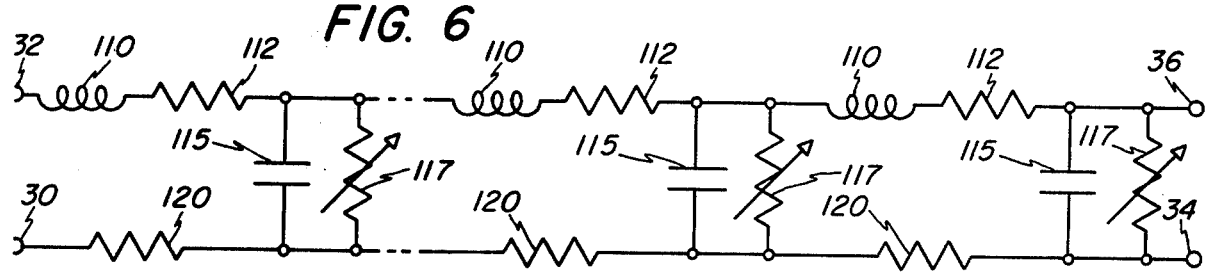
FIG. 6 is the equivalent electrical circuit of the semiconductor neuron.

Referring now to FIG. 6, the equivalent electrical circuit of either a biological neuron or a semiconductor neuron is shown. Inductance 110 represents the inductance per unit length of the biological neuron or columnar semiconductor neuron arising from the coaxial geometry of both types of neurons. Resistance 112 in the case of a biological neuron represents the equivalent resistance per unit length of the body fluids surrounding the nerve fiber. In the case of a semi-conductor neuron made from a N-type germanium ingot with a P-type columnar region, resistance 112 represents the equivalent resistance per unit length of the N-type region parallel to the columnar P-type region. Resistance 120 in the case of a biological neuron represents the equivalent resistance per unit length of the axoplasm of the nerve fiber. In the case of the semi-conductor neuron, resistance 120 represents the resistance per unit length of the P-type region parallel to its own columnar axis. In the case of the biological neuron, capacitance 115 represents the capacitance per unit are associated with the membrane sheath of the nerve fiber. For the semiconductor neuron, capacitance 115 is the forward capacitance per unit area of the P-N junction. Variable resistance 117 represents the ability of the membrane sheath of the biological neuron to change its resistance per unit area when stimulated by a potential above a critical threshold. Similarly, variable resistance 117 represents the variable forward resistance per unit area associated with the tunnel diode characteristics of the P-N junction of the semiconductor neuron.

Because the semiconductor neuron has an equivalent electrical circuit that is functionally the same as the equivalent circuit of the biological neuron, the semiconductor neuron will transmit pulses when given a stimulus potential in accordance with the transmission cable equation well known to those skilled in the art.

From the transmission cable equation, certain properties of the pulse shape and pulse transmission speed are known. The spatial width of the traveling pulse in the case of germanium semiconductor neuron of the type used for illustration purposes is about $7 \times 10^{31\ 2}$ cm for a P-type region of $2.5 \times 10^{-3}$ cm in diameter and a specific resistivity of $10^{-3}$ ohm-centimeters.

For comparison, the spatial width of a pulse in a typical biological neuron is about $10^{-1}$ cm.

The pulse width traveling in the semiconductor neuron is proportional to the square root of the diameter of the P-type region and inversely proportional to the square root of the specific resistivity of the P-type region.

The transmission speed of the pulse along a semiconductor neuron is proportional to the square root of the diameter of the P-type columnar region and inversely proportional to the square root of the specific resistivity of the P-type region and forward capacitance of the P-N junction. For a large N-type germanium ingot with a high conductivity (about $10^{-3}$ ohm-cm), the transmission speed of a pulse is about $3 \times 10^8$ cm/sec. for a P-type region of $5 \times 10^{-3}$ in diameter and with a specific resistivity of $10^{-3}$ ohm-cm operating initially in the forward biases region where the minority carrier diffusion capacitance of the junction is $10^{-3}$ pico farads/cm$^2$ and about $10^4$ cm/sec when operating initially in the reversed bias region with a junction capacitance of $10^4$ pico farads/cm$^2$. For sake of comparison, the pulse speed in a biological neuron is about $10^3$ cm/sec.

The propagation of a pulse along the semiconductor neuron is caused by the differential negative resistance associated with the tunnel diode characteristics of the P-N junction. In the active stimulated area of the junction, the effective resistance of the junction is smaller than the effective resistance of the rest of the junction. Thus when a portion of the junction is stimulated by a potential pulse, the adjacent portion of the P-N junction is thrown into a higher conduction made by the restimulating effect of the local current circuit parallel to and across the P-N junction in response to potential changes. By a repetition of this process of stimulation by the local circuit, the pulse spreads indefinitely on both sides of the site of initial stimulation.

Many modifications and variations of the above teachings will be obvious to those skilled in the art. For example, a semiconductor neuron network can be made by migrating an array of liquid alloy droplets through a semiconductor body and by interconnecting the array. Further, individual semiconductor neurons may be manufactured by the practicing of two thermal migrations in a body 10. A first region of recrystallized degenerative semiconductor material is formed in the body 10. Then the second region of recrystallized degenerative semiconductor material of opposite type conductivity is formed in the first region by thermal gradient zone melting.

The unidirectional thermal gradient may be established substantially parallel to the preferred crystal axis of the material of the body, or alternately, at from 20° to 10° off-axis of the same crystal axis. The off-axis component may be obtained by deliberately cutting the wafers at an off-axis component so that when the unidirectional thermal gradient is established perpendicular to the opposed major surfaces, migration will naturally occur along the off-axis component.

We claim as our invention:

1. A method for making a semiconductor neuron comprising the process steps of:
   (a) selecting a body of semiconductor material having two opposed major surfaces, one of which has a preferred planar crystal orientation, a vertical axis perpendicular to the two opposed major surfaces, a first type conductivity, a predetermined level of resistivity and at least one first region of degenerative semiconductor material dispose in the body, extending entirely through the body and terminating in the opposed major surfaces of the body and having two opposed end surfaces, each end surface being coextensive with a respective one of the major surfaces of the body;
   (b) disposing at least one droplet of a selective material on a selective portion of one of the two opposed end surfaces of at least one of the first regions;
   (c) heating the body and each of the droplets to a temperature sufficient to form a melt of the droplet of material and the semiconductor material on the major surface of the body;
   (d) establishing a unidirectional thermal gradient substantially parallel to the vertical axis of the body and a preferred crystal axis of the material of the body;
   (e) migrating each alloy melt by temperature gradient zone melting processing through the solid material of the respective first region from the first major surface to, and terminating in, the other of the two major opposed surfaces to form a second region of degenerative semiconductor material having solid solubility of the selective material therein and a third and opposite type conductivity than the second type conductivity, as well as to form a P-N junction at the contiguous abutting surfaces of material of opposite type conductivity, the P-N junction extending between, and terminating in, the two opposed major surfaces of the body and having the electrical characteristics of a tunnel diode;
   (d) affixing a first ohmic electrical contact to one of the two opposed end surfaces of a first region;
   (e) affixing a second ohmic electrical contact to one of the two opposed end surfaces of the second region which is coextensive with the one end surface of the first region;
   (f) affixing a third ohmic electrical contact to the other of the two opposed end surfaces of the first region, and
   (g) affixing a fourth ohmic electrical contact to the other of the two opposed end surfaces of the second region.

2. The method of claim 1 wherein
   the opposed major surfaces have a preferred (100) crystal orientation and the unidirectional thermal gradient lies along a <100> crystallographic direction and the selective portion of the major surface area on which the selective material is formed has a square shape with the square sides aligned along <011> and <01$\bar{1}$> directions.

3. The method of claim 1 wherein the opposed major surfaces have a preferred (110) crystal orientation and the unidirectional thermal gradient is established along the <110> direction and the selective portion of the major surface area on which the selective material is formed has a diamond shape.

4. The method of claim 1 wherein the opposed major surfaces have a preferred (111) crystal orientation and the unidirectional thermal gradient is applied along the <111> direction and the selective portion of the major surface area on which the selective material is formed has an equilateral triangular shape with the sides of the triangle aligned along the <0$\bar{1}$1>, <1$\bar{1}$0> and the <10$\bar{1}$> directions.

5. The process of claim 1 wherein the unidirectional thermal gradient has a magnitude from 20° C./cm to 300° C./cm.

6. The method of claim 1 wherein the semiconductor material of the body is degenerate N-type germanium doped with an N-type dopant selected from the group consisting of phosphorus, arsenic and antimony.

7. The method of claim 7 wherein the selective material formed on a selective portion of one major surface of the body is a P-type dopant selected from the group consisting of gallium and aluminum.

8. The method of claim 1 wherein the ohmic electrical contact for a P-type region is a material selected from the group consisting of tin, indium, aluminum, gallium and gold.

9. The process of claim 1 wherein the ohmic electrical contact for a P-type region is an alloy consisting of at least two atomic percent gallium and at least one material selected from the group consisting of tin, indium and gold.

10. The process of claim 8 wherein the ohmic electrical contact for an N-type region is a material selected from the group consisting of tin, gold, arsenic, antimony and indium.

11. The process of claim 1 wherein the ohmic electrical contact for a P-type region is an alloy comprising at least two atomic percent aluminum and at least one material selected from the group consisting of indium, tin and gold.

12. The method of claim 1 wherein the ohmic electrical contact for the N-type region is an alloy comprising at least two atomic percent arsenic and at least one material selected from the group consisting of indium, tin and gold.

13. The method of claim 1 wherein the ohmic electrical contact for an N-type region is an alloy comprising at least two atomic percent antimony and at least one material selected from the group consisting of tin, indium, and gold.

* * * * *